(12) United States Patent
Dangelmaier et al.

(10) Patent No.: US 10,781,095 B2
(45) Date of Patent: Sep. 22, 2020

(54) MOLDED LEAD FRAME SENSOR PACKAGE

(71) Applicant: Infineon Technologies AG, Neubiberg (DE)

(72) Inventors: Jochen Dangelmaier, Beratzhausen (DE); Manfred Schindler, Regensburg (DE); Horst Theuss, Wenzenbach (DE); Mathias Vaupel, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 7 days.

(21) Appl. No.: 16/222,589

(22) Filed: Dec. 17, 2018

(65) Prior Publication Data
US 2020/0189908 A1    Jun. 18, 2020

(51) Int. Cl.
*B81B 7/00* (2006.01)
*B81C 1/00* (2006.01)

(52) U.S. Cl.
CPC .......... *B81B 7/0061* (2013.01); *B81B 7/0064* (2013.01); *B81C 1/00309* (2013.01); *B81B 2201/0214* (2013.01); *B81B 2201/0257* (2013.01); *B81B 2201/0264* (2013.01); *B81B 2201/0292* (2013.01); *B81B 2207/098* (2013.01); *B81C 2203/0154* (2013.01)

(58) Field of Classification Search
CPC .. B81B 7/0061; B81B 7/0064; B81C 1/00309
USPC ........................................................ 257/414
See application file for complete search history.

(56) References Cited

U.S. PATENT DOCUMENTS

| | | | |
|---|---|---|---|
| 2005/0101161 A1* | 5/2005 | Weiblen | B81B 7/0064 439/37 |
| 2009/0282915 A1* | 11/2009 | Ohta | B81B 7/0058 73/504.12 |
| 2015/0023523 A1* | 1/2015 | Elian | H04R 1/083 381/91 |
| 2015/0344294 A1* | 12/2015 | Ghahremani | B81B 7/007 257/419 |
| 2016/0043664 A1* | 2/2016 | Theuss | B81B 7/007 310/300 |

OTHER PUBLICATIONS

Semicon West, "Advance Packaging Technologies for Miniaturized Modules", http://www.semiconwest.org/sites/semiconwest.org/files/data15/docs/3_Vinayak%20Pandey_STATS%20ChipPAC_PDF.pdf, Jul. 12-14, 2016, 14 pages.
Haesung DS, "Semiconductor Artisan", http://www.haesungds.com/eng/?p=products%7Clead_frame%7Cnext_generation_substrate, 2018, 4 pages.

* cited by examiner

*Primary Examiner* — Igwe U Anya
(74) *Attorney, Agent, or Firm* — Harrity & Harrity, LLP

(57) ABSTRACT

Examples provided herein are associated with a molded lead frame of a sensor package. An example sensor package may include a molded lead frame that includes an opening in the molded lead frame, wherein the opening extends from a mount-side of the molded lead frame to a chip-side of the molded lead frame, wherein the chip-side of the molded lead frame is opposite the mount-side; and a sensor mounted to the chip-side of the molded lead frame.

20 Claims, 10 Drawing Sheets

MOLDED LEAD FRAME SENSOR PACKAGE

BACKGROUND

An integrated circuit may include one or more components of an electronic circuit. The one or more components may be included within one or more semiconductor chips of a package. In some cases, the one or more components and/or the one or more semiconductor chips may be configured, within the package, as a sensor that is to measure one or more characteristics (e.g., pressure, light, content, and/or the like) of an environment of the package.

SUMMARY

According to some implementations, a method may include forming an opening in a lead frame, wherein the lead frame comprises a conductive material and a non-conductive material, wherein the opening extends from a mount-side of the lead frame to a chip-side of the lead frame, wherein the chip-side of the lead frame is opposite the mount-side, and wherein the opening is configured to provide a signal port for a sensor, wherein the signal port enables the sensor to be configured to measure a parameter associated with an environment of the mount-side of the lead frame; and forming the lead frame to enable the sensor and signal port to be included in a sensor package.

According to some implementations, a method may include forming an opening in a lead frame, wherein the lead frame comprises a conductive material and a non-conductive material, and wherein the opening extends from a mount-side of the lead frame to a chip-side of the lead frame, wherein the chip-side of the lead frame is opposite the mount-side; and forming a support structure for the sensor package using a molding process, wherein the molding process forms the support structure from molding material that is received in the opening.

According to some implementations, a sensor package may include a molded lead frame that includes an opening in the molded lead frame, wherein the opening extends from a mount-side of the molded lead frame to a chip-side of the molded lead frame, wherein the chip-side of the molded lead frame is opposite the mount-side; and a sensor mounted to the chip-side of the molded lead frame.

DETAILED DESCRIPTION

Figure 1:
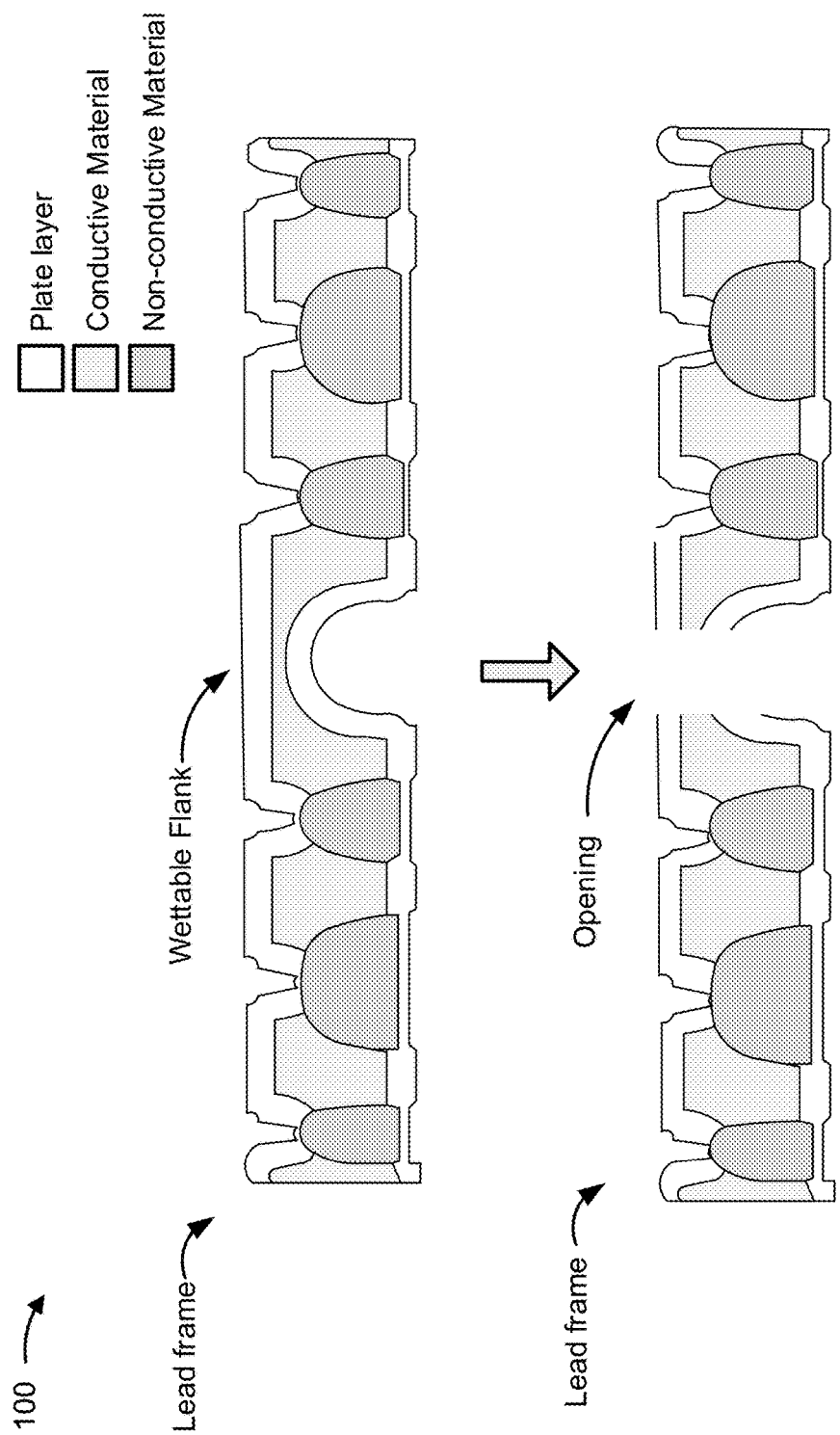
FIG. 1 is a diagram of an example implementation of forming an opening in a molded lead frame described herein.

The following detailed description of example implementations refers to the accompanying drawings. The same reference numbers in different drawings may identify the same or similar elements.

In some instances, an integrated circuit package that includes one or more semiconductor chips and/or one or more components is to be configured as a sensor (referred to herein as a "sensor package"). In many cases, a sensor package includes an opening in the housing of the package (e.g., a signal port) to permit the sensor package to measure a characteristic of the environment of the sensor package. For example, the opening may allow a light signal to be detectable by a light sensor, a pressure (e.g., an air pressure) to be detectable by a pressure sensor, an acoustic signal to be sensed by a microphone, a content of air or a gas in the environment to be detectable by a gas sensor, and/or the like. According to previous techniques, such signal ports may be included within lids of the semiconductor package that are used to cover the sensor components during assembly and before a molding process occurs. Furthermore, previous techniques may extend the hole through the external housing of the sensor package. Therefore, according to some previous techniques, signal ports were not configured to be on a side of the sensor package that included a lead frame and/or a substrate to which the lead frame is to be mounted because the lid and/or housing was mounted to the lead frame. However, such signal ports may diminish the strength of the sensor package (e.g., due to the holes in the lid and/or housing), cause a relatively high thermomechanical stress on the semiconductor chip of the sensor package (which diminishes performance and increases the margin of error and/or accuracy of the sensors), and are relatively costly due to the need for a customization of the molding process and/or manufacturing of the lid to include the signal ports.

According to some implementations described herein, an opening is formed in a molded lead frame of a sensor package. The molded lead frame may include a conductive material (e.g., which may form the leads of the sensor package and/or traces between components and/or semiconductor chips of the sensor package) and a non-conductive material. The opening may extend from a mount-side of the molded lead frame to a chip-side of the molded lead frame (that is opposite the mount-side). In this way, the opening, as described herein, provides a signal port for a sensor of the sensor package and enables the sensor to measure a parameter associated with an environment (or characteristic of the environment) of the mount-side of the molded lead frame. Additionally, or alternatively, the opening may serve to support a support structure of the sensor package. For example, the opening may receive a molding material that serves as a support structure of the sensor package. Such a support structure may be structurally reinforced by the molded lead frame via the openings in the molded lead frame.

Furthermore, some implementations described herein can provide added strength over previous technologies as the molded lead frame provides durability and flexibility for the sensor package. Moreover, to provide the increased strength, flexibility, and/or durability (to withstand greater stresses than sensor packages formed using previous techniques), the opening in the molded lead frame can be formed at designated locations of the molded lead frame (e.g., at locations corresponding to wettable flank locations) that are configured to maintain the strength, flexibility, and durability of the molded lead frame. Furthermore, the opening in the molded lead frame may expose a lower thermomechanical stress on the semiconductor chip of the sensor package (e.g., during temperature cycling), which results in better performance of the sensor (e.g., increased accuracy and lower drift characteristics) relative to previous techniques, by using the strength of the molded lead frame.

FIG. 1 is a diagram of an example implementation 100 of forming an opening in a molded lead frame described herein. In example implementation 100, a lead frame includes a plate layer, a conductive material, and a non-conductive material. Accordingly, the lead frame may be a molded lead frame. The conductive material may be any suitable conductive material, such as a metal or metal alloy that includes one or more metals (e.g., copper, silicon, gold, nickel, palladium, and/or the like). Furthermore, the non-conductive material may be any suitable non-conductive material, such as a polymer (e.g., a thermoplastic material, a resin, and/or the like).

As shown in FIG. 1, the lead frame may include a wettable flank. The wettable flank is a portion of the lead frame that is configured to receive a mounting material (e.g. solder). Accordingly, the wettable flank may be formed to serve as an end of a lead of the lead frame (hence "flank") and/or configured to enable the lead to be soldered to a substrate (e.g., a printed circuit board (PCB)) and/or is configured to receive or hold solder (hence "wettable") during a mounting process (e.g., using surface mount technology (SMT)).

Forming the wettable flank of the lead frame in FIG. 1 may involve several process steps. For example, from a piece of raw conductive material, a location may be pre-configured to include the wettable flank because the conductive material, relative to the non-conductive material, may be more durable. Accordingly, a wettable flank may be configured to be at a location of the lead frame where the conductive material has a threshold diameter and/or a threshold width between segments or portions of the lead frame that include the non-conductive material. Therefore, during an etching process of the mount side of the lead frame, none of the conductive material is removed from the wettable flank location. Then, the non-conductive material may be filled into the etched portions of the lead frame (e.g., to reinforce the lead frame and/or provide flexibility). The lead frame may undergo a grinding process to remove any excess non-conductive material from the lead frame (e.g., the bottom-side of the lead frame in FIG. 1). Subsequently, the wettable flank may be formed via another etching process following the grinding process. In some implementations, the lead frame may undergo a plating process (or printing process) to include the plate layer. The plate layer may be an additional conductive layer (which may be formed of the same or different material as the conductive material). In some implementations, the plate layer may provide additional strength and/or certain electrical properties of the lead frame.

According to some implementations described herein, an opening may be formed at a location of the molded lead frame that includes a wettable flank. For example, by taking advantage of the characteristics of the lead frame at the location of the wettable flank, the process of forming a recess in the molded lead frame to form the wettable flank may be adapted to extend the recess from the bottom-side (which may be a mount-side) of the lead frame in FIG. 1 to a top side (which may be the chip-side) of the lead frame to form the opening. Accordingly, the opening, being in the location of the wettable flank, may not sacrifice the durability of the molded lead frame while taking advantage of the increased routing capability provided by the lead frame (e.g., as a molded lead frame).

In some implementations, the above described process of forming the wettable flank may include one or more additional steps to form the opening in the lead frame. For example, after the wettable flank is formed (e.g., from the etching process following the grinding process), a subsequent drilling process may be performed to form the opening at the wettable flank. Additionally, or alternatively, the etching process itself may be used to form the opening at the wettable flank. In some implementations, such a drilling process and/or etching process may be performed before and/or after a plating process to form the plate layer.

In some implementations, before and/or after the opening in the lead frame is formed, the lead frame may undergo one or more other processes to form the lead frame. For example, the lead frame may be etched with a circuit for a sensor of the sensor package. In such cases, the lead frame may provide traces for the circuit and/or mounting surfaces for one or components (e.g., components of the sensor) of the circuit.

In this way, an opening can be formed in a molded lead frame (e.g., at a wettable flank location, using a wettable flank forming process, and/or the like) to permit a signal port to be included in a sensor package and/or a support structure for the sensor package to be formed using the opening.

As indicated above, FIG. 1 is provided merely as an example. Other examples may differ from what was described with regard to FIG. 1.

Figure 2:
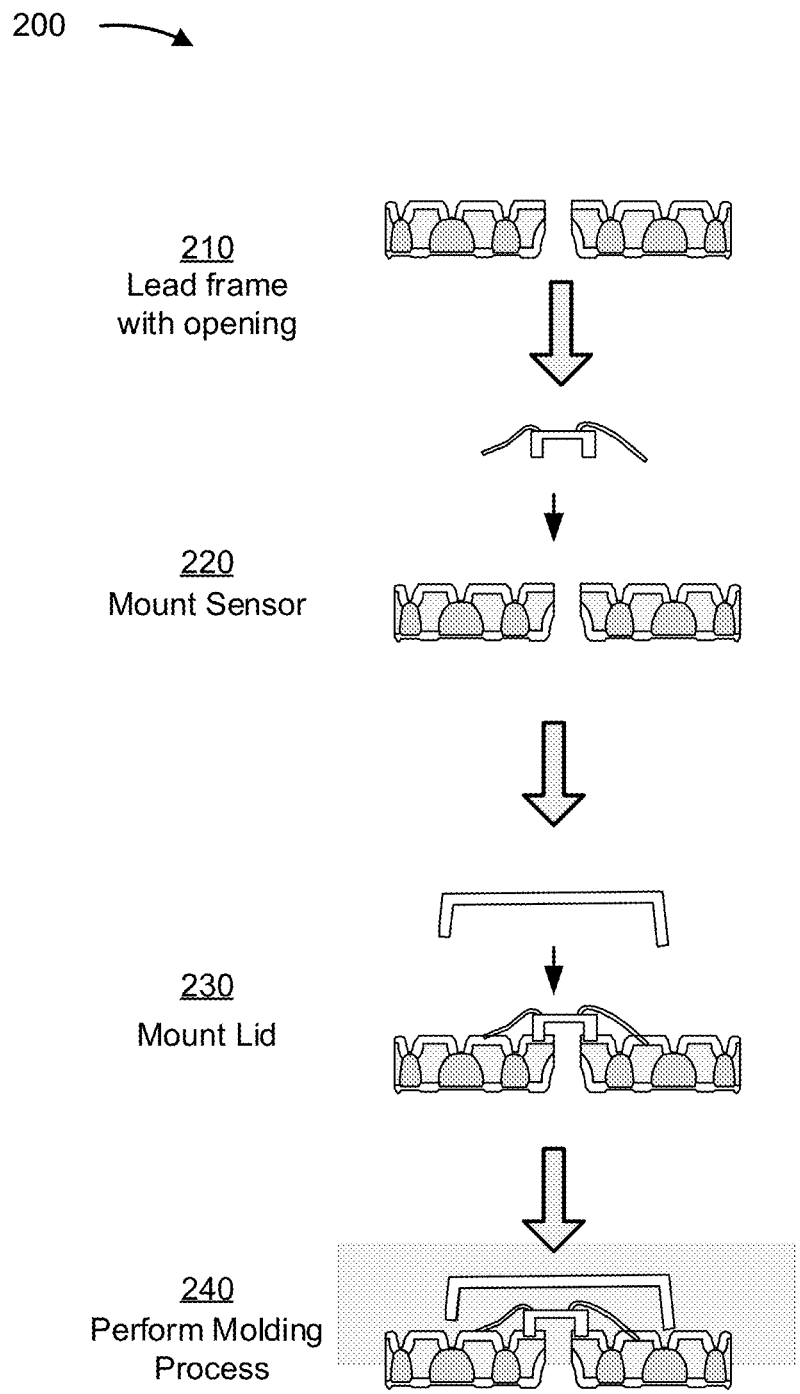
FIG. 2 is a diagram of an example implementation of forming a sensor package described herein.

FIG. 2 is a diagram of an example implementation 200 of forming a sensor package described herein. Forming of the sensor package in example implementation 200 may be performed by a machine (e.g., a sensor package manufacturing machine, a sensor assembly machine, and/or the like) that is configured to assemble the sensor package as shown.

As shown in FIG. 2, and by reference number 210, a lead frame with an opening (which may have been formed in connection with the description of FIG. 1) is obtained. In the example of FIG. 2, the opening may serve as a signal port for a sensor. The lead frame may be received by the machine (e.g., via a lead frame feeder, such as a chute, conveyor, and/or the like) and/or retrieved by the machine (e.g., via an SMT machine picker) to begin assembly and/or manufacturing of the sensor package, as described herein. In this way, the opening may be formed in the lead frame before a die attach process (e.g., a mounting process that mounts components or semiconductor chips to the molded lead frame).

As further shown in FIG. 2, and by reference number 220, the sensor (or sensor component) is mounted to the top-side (or chip-side) of the lead frame. The sensor may be mounted to top-side of the lead frame via a bonding process (e.g., soldering, sintering, gluing, and/or the like). Additionally, or alternatively, the sensor may be electrically connected to the lead frame by bonding one or more wires to the sensor and/or the lead frame. In some implementations, the wires may provide an electrical connection and/or enable the sensor to be mounted to the lead frame. Additionally, or alternatively, the sensor may be mounted to the lead frame using a flip chip technology, which may also establish an electrical connection with the lead frame.

As shown in example implementation 200 of FIG. 2, the sensor is mounted over the opening (e.g., aligned with the signal port). Such positioning of the sensor may permit the sensor to measure a parameter of an environment via the signal port in a different manner than if the sensor were not positioned over the signal port. The sensor (or sensor component) may be (or may be associated with) a microphone, a pressure sensor, a gas sensor, a magnetic sensor, a light sensor, and/or the like. In some implementations, the sensor (or a component of the sensor) may not be aligned with the signal port, but is mounted near the signal port. Furthermore, in some implementations, a component of the sensor that is electrically connected to the sensor (e.g., via a wire) may be mounted over the signal port while another component of the sensor (e.g., a microcontroller) is not aligned with the signal port. In some implementations, different types of sensors and/or sensor components may be configured to be mounted over the signal port based on the type of sensor, the parameter of the environment that is to be measured, the type of measurement of the parameter that is to be performed by the sensor, and/or the like. For example, a microphone may be configured to be directly over the signal port to more directly sense an acoustic signal and/or pressure, while a gas sensor (or gas sensor component) may be positioned near the signal port (e.g., within a threshold distance of the signal port, such as a distance that corresponds to a configuration of the sensor package) to allow for a gas to flow into the sensor package to determine the content (e.g., the types of molecules) of the gas.

As further shown in FIG. 2, and by reference number 230, a lid may be mounted to the top-side of the lead frame (e.g., after the die attach process to mount the sensor). The lid provides an enclosed cavity to be formed around the sensor and/or signal port relative to the top-side (or chip-side) of the lead frame. The lid may include any suitable material, including a conductive material (e.g., to permit electrostatic discharge (ESD) shielding, to serve as an antenna, to include circuitry, and/or the like) or a non-conductive material (e.g., to not cause shielding, to insulate the sensor, and/or the like). In some implementations, the lid may be mounted to the lead frame using any suitable technique, such as gluing, soldering, sintering, and/or the like.

As further shown in FIG. 2, and by reference number 240, the machine may form the sensor package using a molding process. For example, the machine may perform the molding process by attaching molding material (e.g., a non-conductive material, such as a thermoset material, a thermoplastic material, and/or the like) to the lead frame. The molding process to form the sensor package (and/or the molding material of the sensor package) may be any suitable molding process, such as an over-molding process, a rotational molding process, a mold dipping process, a thermoforming process, a blow molding process, a compression molding process, and/or the like.

In some implementations, the molding material may be a preformed mold that can be mounted (e.g., via a gluing process) to the top-side of the lead frame. For example, the molding material may be configured to fit over the lid in example implementation 200. In some implementations, a preformed mold may be configured such that a lid is not necessary. For example, rather than mounting the lid, the machine may simply mount the preformed molding material after the sensor is mounted to the lead frame.

In some implementations, a molding process may be performed that uses an opening in the lead frame to form a support structure of the sensor package. For example, an opening of the molded lead frame may receive molding material that is shaped to form a support structure (e.g., a pillar, a peg, and/or the like) that is fit into the opening via the molding process (e.g., after the molding material is cured). Accordingly, one or more additional openings that are formed in the lead frame of example implementation 200 may be configured to hold a support structure of sensor package and/or the molding material of FIG. 2.

In this way, a sensor package may be formed that permits a sensor to measure a parameter corresponding to a characteristic of the environment on the mount-side of the lead frame (e.g., a content of a gas received through the opening, an amount of light detected through the opening, a pressure associated with a gas or liquid received through the opening, an acoustic signal received through the opening, a magnetic field detected through the signal port, and/or the like).

As indicated above, FIG. 2 is provided merely as an example. Other examples may differ from what was described with regard to FIG. 2.

Figure 3:
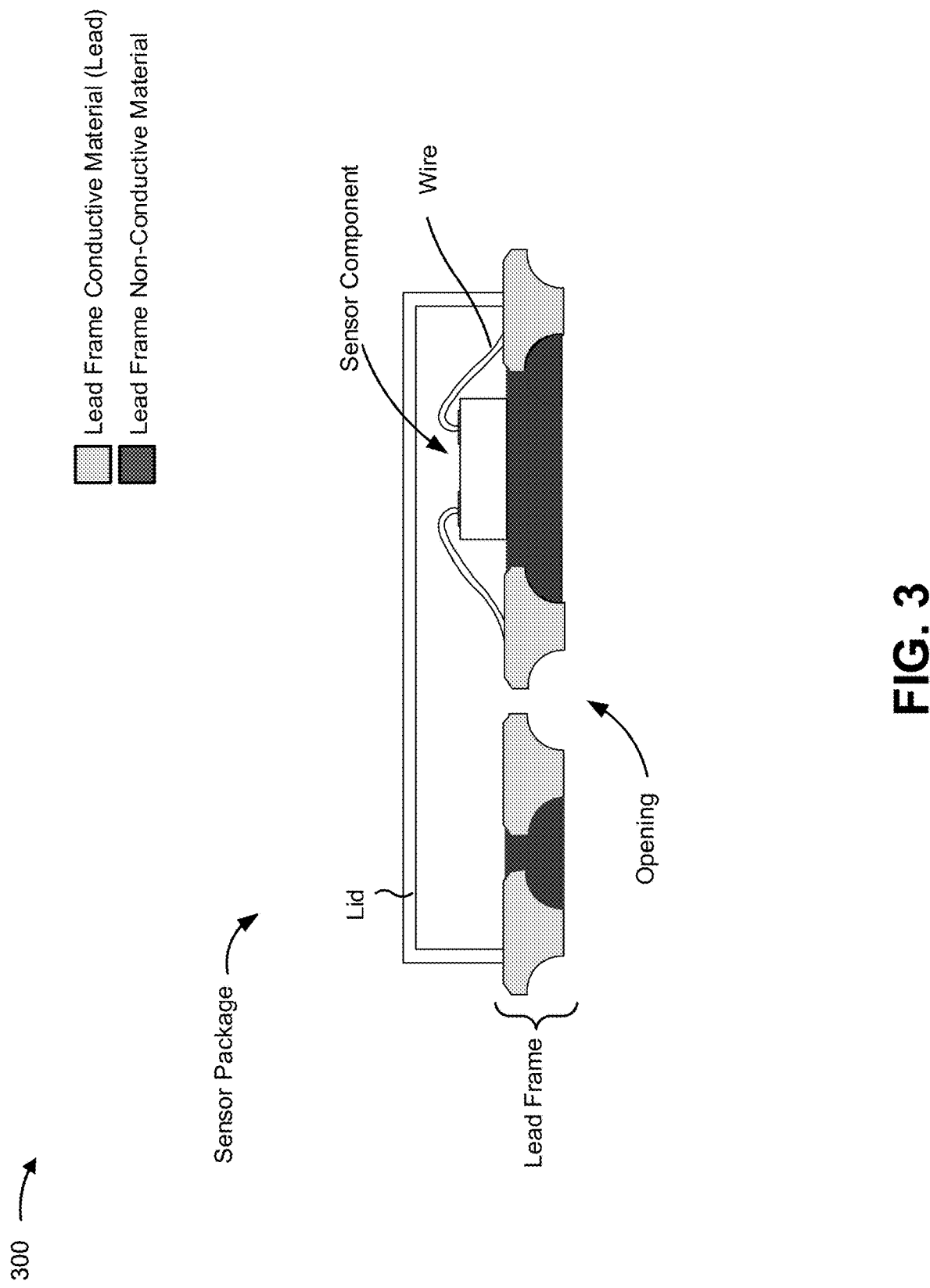
FIGS. 3-8 are diagrams of example implementations of sensor packages that may be formed, as described herein.

FIG. 3 is a diagram of an example implementation 300 of a sensor package that may be formed, as described herein. As shown in FIG. 3, an opening is formed in a molded lead frame that includes both conductive material and non-conductive material. In example implementation 300, the opening may serve as a signal port of the sensor package. Furthermore, in example implementation 300, a sensor component is mounted on the top-side (or chip-side) of the molded lead frame and under a lid such that the sensor component may measure a parameter of an environment of the bottom-side (or mount-side) of the molded lead frame. In the example of FIG. 3, the sensor component is not aligned with the signal port and is electrically connected to the molded lead frame. Accordingly, as an example use of the sensor package of example implementation 300, a gas (e.g., air or other gas) may flow from the bottom-side of the molded lead frame into a cavity formed by the lid to permit the sensor component to measure the parameter of the environment.

As shown in FIG. 3, the sensor component is mounted to the non-conductive material (e.g., via a gluing process) and electrically connected to the conductive material (e.g., one or more leads) of the lead frame via one or more wires. Accordingly, the sensor component may be controlled by and/or provide information to another component via an electrical connection formed by the conductive material of the molded lead frame. Furthermore, the lid is mounted to the conductive material of the lead frame. In such cases, the lid may be a conductive material and/or may be mounted to the lead frame via a soldering process. Additionally, or alternatively, the lid may be a non-conductive material that is mounted to the lead frame via a gluing process (or other type of adhesion process).

In this way, a sensor package, that includes a lid and a sensor component (mounted to non-conductive material of a molded lead frame) is provided to include an opening, in the molded lead frame, that serves as a signal port of the sensor package.

As indicated above, FIG. 3 is provided merely as an example. Other examples may differ from what was described with regard to FIG. 3.

Figure 4:
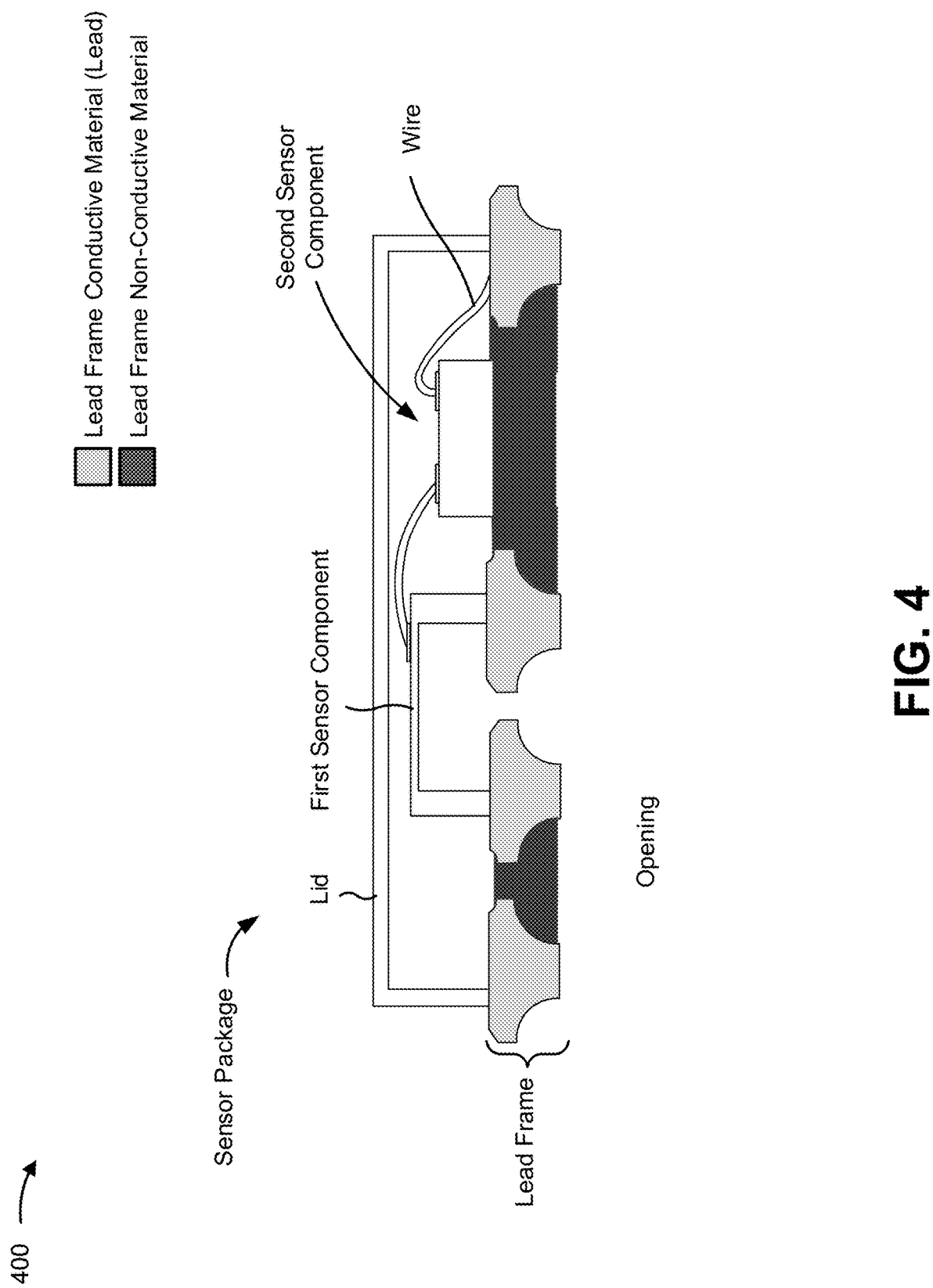

FIG. 4 is a diagram of an example implementation 400 of a sensor package that may be formed, as described herein. As shown in FIG. 4, an opening is formed in a molded lead frame that includes both conductive material and non-conductive material. In example implementation 400, the opening may serve as a signal port of the sensor package. Furthermore, as shown in FIG. 4, a first sensor component and a second sensor component are mounted to the top-side (or chip-side) of the molded lead frame and under a lid such that the first sensor component and second sensor component may be used to measure a parameter of an environment on the bottom-side (or mount-side) of the molded lead frame. In example implementation 400 of FIG. 4, a first sensor component is aligned with the signal port and communicatively coupled to the second sensor component that is not aligned with the signal port. The first sensor component and the second sensor component may be electrically connected via a wire that is bonded to the first sensor component and the second sensor component. Accordingly, the first sensor component and the second sensor component may be used to measure a parameter of the environment via the signal port as described herein.

Furthermore, the first sensor component is mounted (e.g., via a soldering) to the conductive material (e.g., one or more leads) of the lead frame and the second sensor component is mounted to the non-conductive material of the molded lead frame (e.g., via a gluing process). Furthermore, as shown in FIG. 4, the second sensor component is electrically connected to the conductive material of the molded lead frame (e.g., a lead of the molded lead frame) via a wire. The lid may be mounted to the molded lead frame in a similar manner as described above in connection with FIG. 3.

In this way, a sensor package, that includes a plurality of sensor components and a lid, is provided to include an opening, in the molded lead frame, that serves as a signal port of the sensor package.

As indicated above, FIG. 4 is provided merely as an example. Other examples may differ from what was described with regard to FIG. 4.

Figure 5:
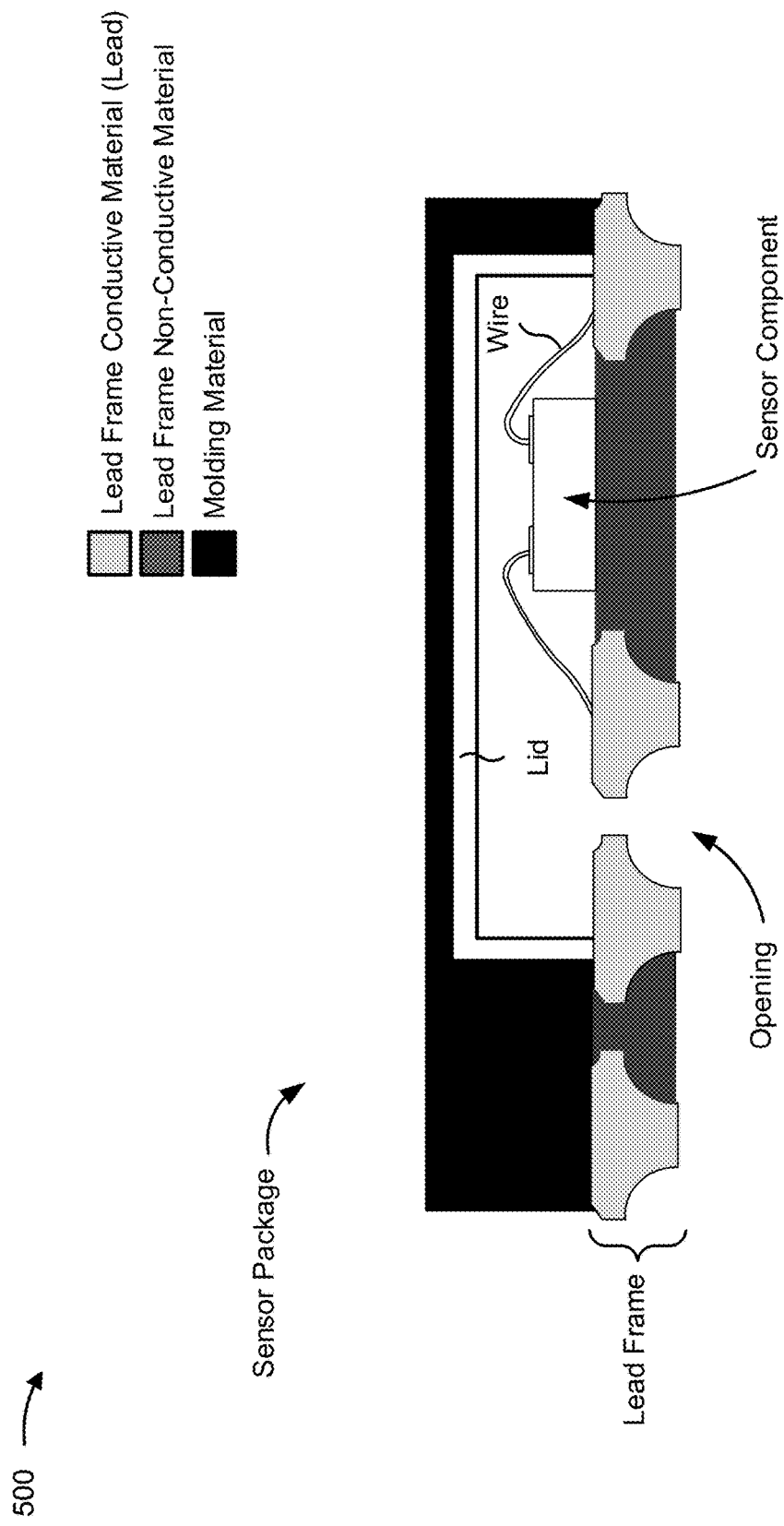

FIG. 5 is a diagram of an example implementation 500 of a sensor package that may be formed, as described herein. As shown in FIG. 5, an opening is formed in a molded lead frame that includes both conductive material and non-conductive material. In example implementation 500, the opening may serve as a signal port of the sensor package. The sensor package of example implementation 500 may be formed via a molding process that fixes molding material to the top-side (or chip-side) of the molded lead frame. The molding material may be fixed to the conductive material and/or non-conductive material of the lead frame.

The molding material may include conductive material (e.g., a metallized material) and/or non-conductive material (e.g., a thermoset material, a thermoplastic material, and/or the like). In some implementations, the molding material may include a metallized material that can be used for ESD shielding, antenna structures, circuitry associated with the sensor package, and/or the like. In some implementations, the molding material may allow for package on package stacking (e.g., via a soldering process) that includes mounting one or more other packages to the sensor package of FIG. 5.

In some implementations, the molding material of example implementation 500 may be a preformed mold that is configured to fit a lid that forms a cavity over a sensor component (e.g., similar to the sensor package described above in connection with FIG. 3). In such cases, the preformed mold may be attached (e.g., via a gluing process) to the molded lead frame (e.g., to the conductive material and/or the non-conductive material).

In this way, a sensor package, that includes molding material (or a mold), a lid, and a sensor component, is provided to include an opening, in the molded lead frame, that serves as a signal port of the sensor package.

As indicated above, FIG. 5 is provided merely as an example. Other examples may differ from what was described with regard to FIG. 5.

Figure 6:
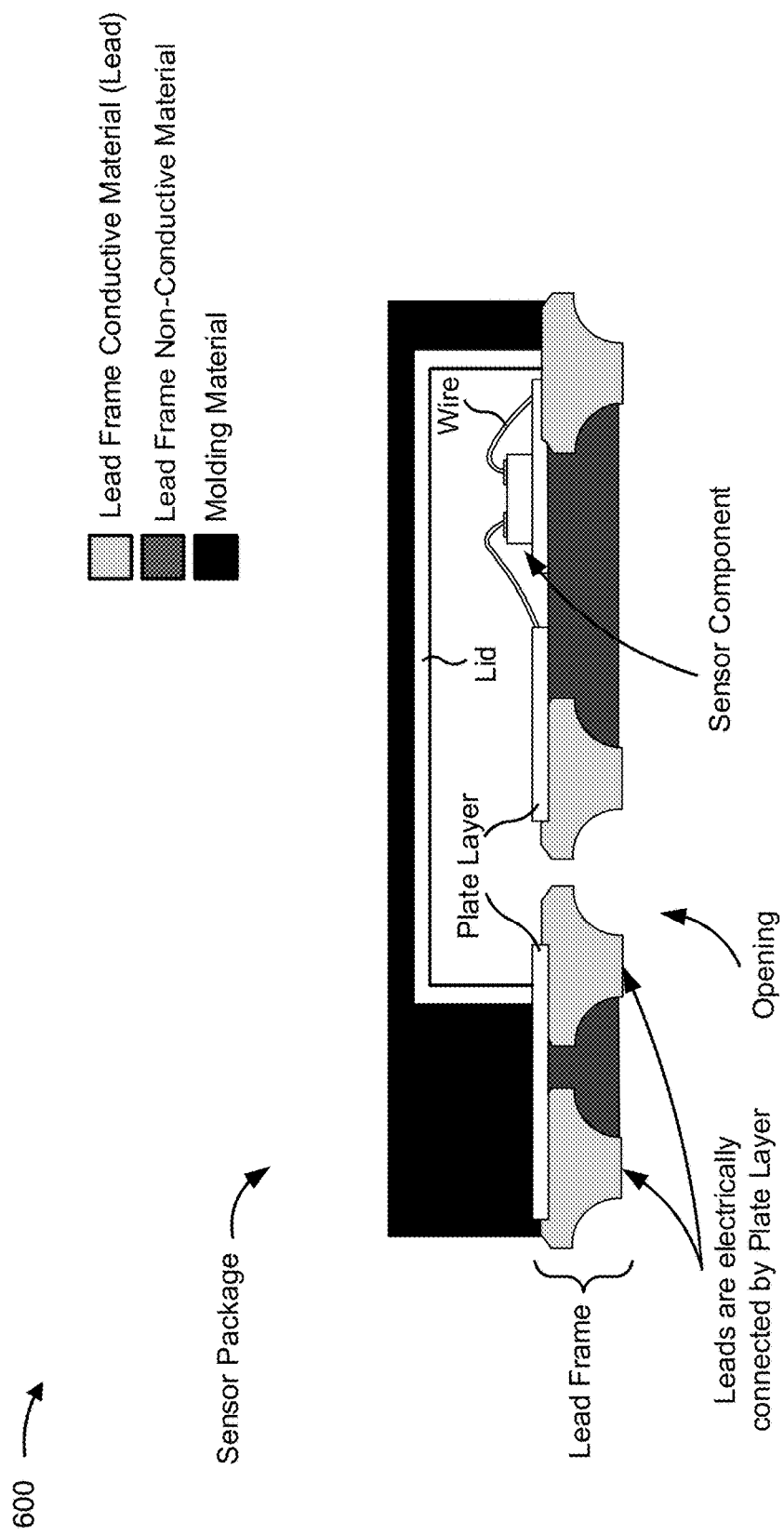

FIG. 6 is a diagram of an example implementation 600 of a sensor package that may be formed, as described herein. As shown in FIG. 6, an opening is formed in a molded lead frame that includes conductive material, non-conductive material, and a plate layer. In example implementation 600, the opening may serve as a signal port of the sensor package. The plate layer may be any conductive layer formed from any conductive material that is configured to provide an electrical connection between one or more components that are electrically connected to the molded lead frame and/or between one or more leads of the molded lead frame. Additionally, or alternatively, the plate layer may provide a mounting surface that can permit a sensor component and/or a lid to be mounted over a senor component of the sensor package. The plate layer may be formed and/or attached to the molded lead frame using any suitable process, such as a plating process, a printing process, and/or the like.

As shown in FIG. 6, the plate layer may form an electrical connection between a plurality of leads of the molded lead frame. Furthermore, the sensor component may be mounted to the plate layer and the plate layer may provide an electrical connection between one or more leads of the molded lead frame and the sensor component. The sensor component may be electrically connected to the plate layer via one or more wires (e.g., via a bonding process). Furthermore, the lid may be mounted to the plate layer and/or the molded lead frame, as shown, using any suitable process (e.g., soldering, gluing, and/or the like). Furthermore, as shown, a molding material may be attached to the molded lead frame and/or lid of the sensor package as described in connection with FIG. 5.

In this way, a sensor package is provided to include a molded lead frame that includes a plate layer and that has an opening to serve as a signal port of the sensor package.

As indicated above, FIG. 6 is provided merely as an example. Other examples may differ from what was described with regard to FIG. 6.

Figure 7:
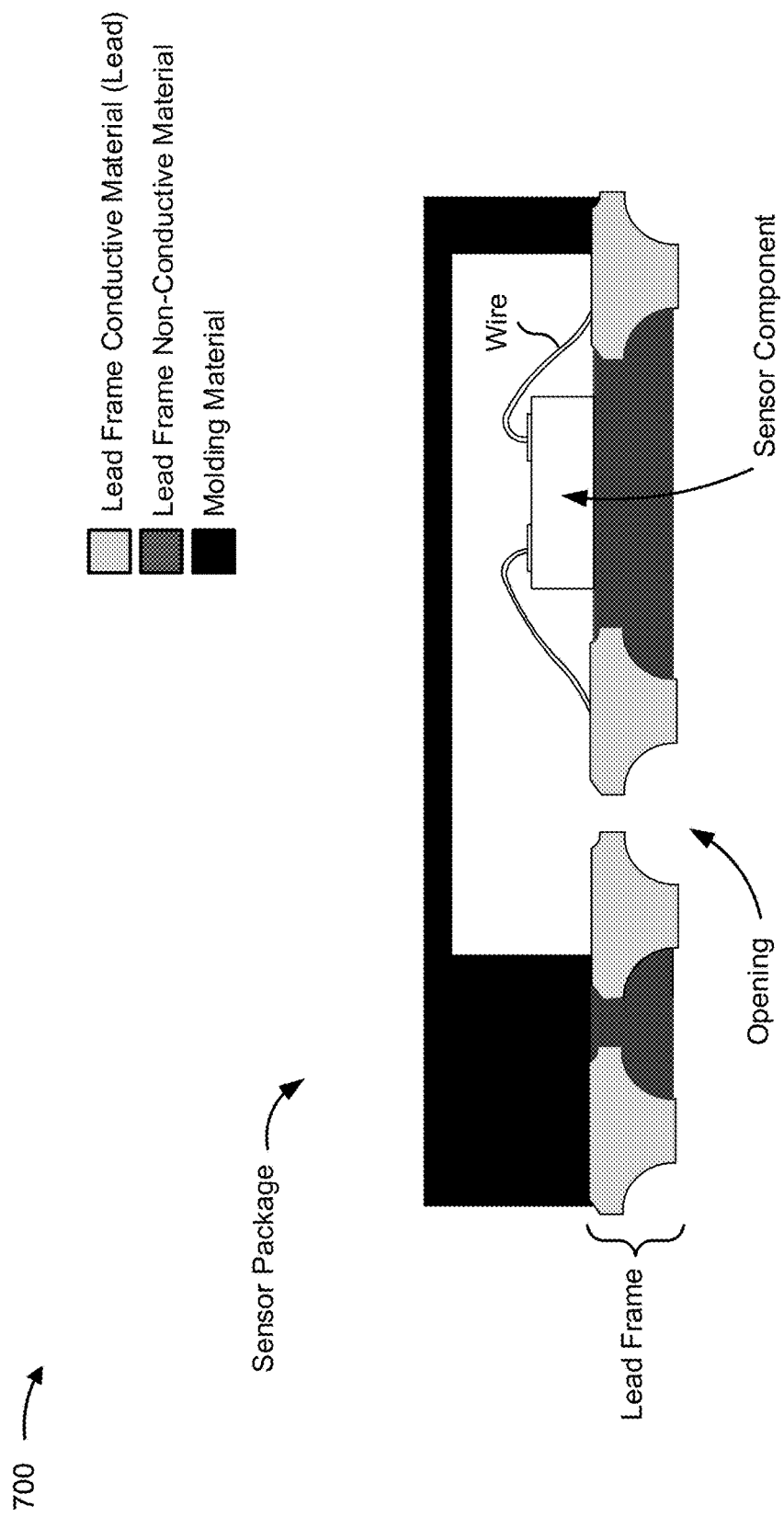

FIG. 7 is a diagram of an example implementation 700 of a sensor package that may be formed, as described herein. As shown in FIG. 7, an opening is formed in a molded lead frame that includes both conductive material and non-conductive material. In example implementation 700, the opening may serve as a signal port of the sensor package. The sensor package of example implementation 700 may be formed from a pre-molded mold that is formed from molding material, as described herein. Accordingly, as shown, the sensor package of FIG. 7 may not include a lid, as described above in connection with FIGS. 3-6. The molding material of example implementation 700 may be molded from a mold-preform process and attached (e.g., via a gluing process) to the molded lead frame the sensor package.

In this way, a sensor package is provided to include a pre-molded material that is attached to a molded lead frame that includes an opening to serve as a signal port of a sensor package.

As indicated above, FIG. 7 is provided merely as an example. Other examples may differ from what was described with regard to FIG. 7.

Figure 8:
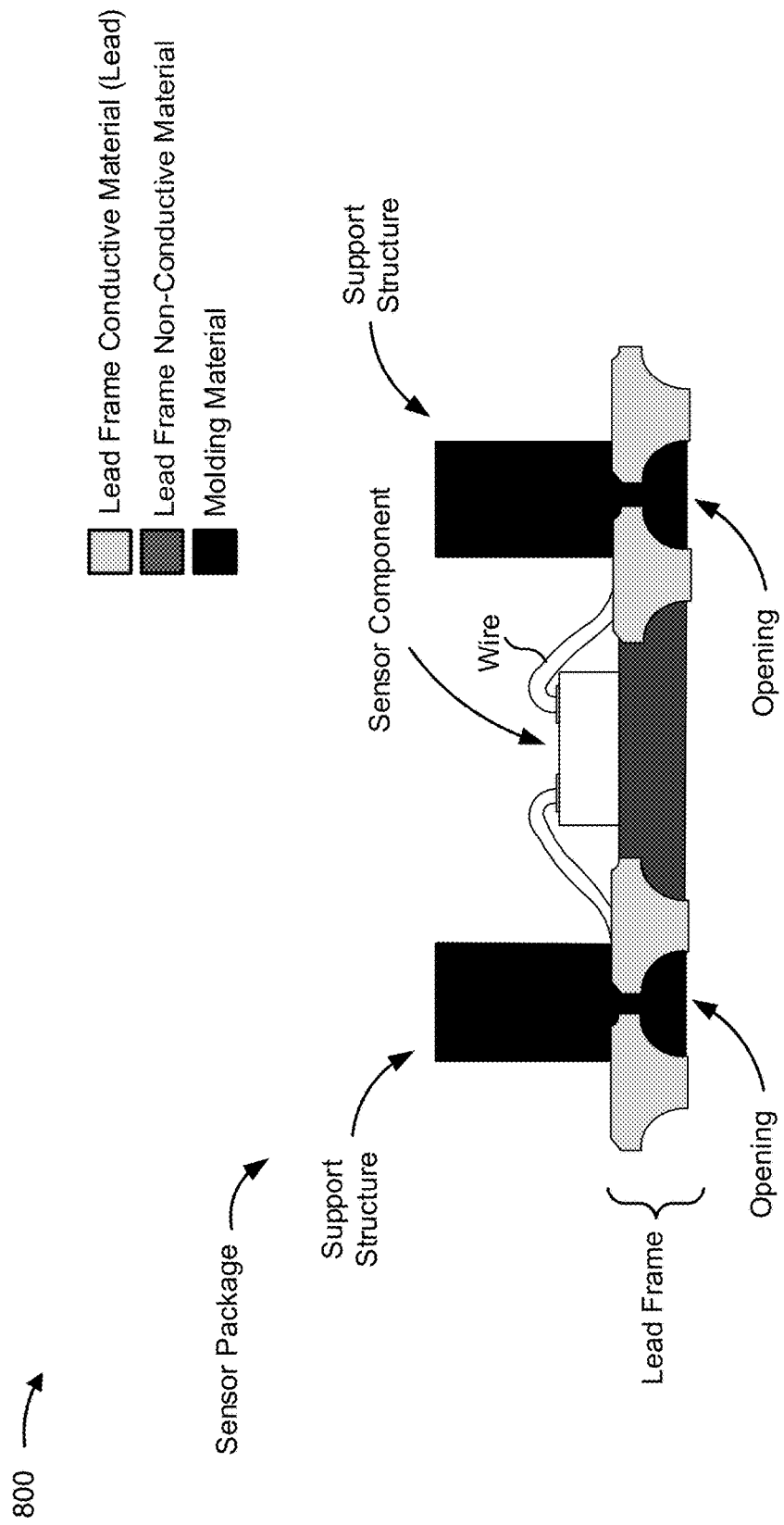

FIG. 8 is a diagram of an example implementation 800 of a sensor package that may be formed, as described herein. As shown in FIG. 8, one or more openings may be formed in a molded lead frame that includes both conductive and non-conductive material. In example implementation 800, two openings may hold molding material for a support structure of the sensor package. Accordingly, the openings may serve as a base or structure to hold the support structure of the sensor package. in example implementation 800, a sensor component is mounted on the top-side (or chip-side) of the molded lead frame and between two support structures formed from molding material received in the two openings. In some implementations, the sensor component is mounted to the molded lead frame and/or electrically connected to the molded lead frame before the support structures are formed using the two openings. On the other hand, in some implementations, the sensor component is mounted to the molded lead frame and/or electrically connected to the molded lead frame after the support structures are formed using the two openings.

The openings of example implementation 800 may be formed in the molded lead frame as described herein.

Furthermore, the support structures may be formed using the two openings using any suitable molding process, as described herein. Accordingly, in the example implementation 800, rather than the opening serving as a signal port (as is described in connection with at least the implementations of FIGS. 1-7), the opening may service as a base or structure to hold the support structure. Therefore, the support structure and/or another element of the sensor package may include a signal port to permit the sensor component to measure a parameter associated with an environment of example implementation 800. For example, a lid (e.g., a conductive or non-conductive plate) may be attached to the support structures (e.g., via a gluing process) of the sensor package. In such a case, the lid may include an opening (e.g., to serve as a signal port for the sensor component).

In some implementations, a molded lead frame of a sensor package may include an opening to serve as a signal port and one or more openings to serve as one or more bases or structures for a support structure of the sensor package. In such a case, the support structure may be configured to enclose the sensor component and the opening serving as the signal port to permit the sensor component to measure a parameter associated with an environment of the sensor package (e.g., an environment on a mount-side of the molded lead frame of the sensor package).

In this way, a sensor package that includes a molded lead frame with one or more openings may include a support structure that is formed and/or supported by the one or more openings in the molded lead frame.

As indicated above, FIG. 8 is provided merely as an example. Other examples may differ from what was described with regard to FIG. 8.

Figure 9:
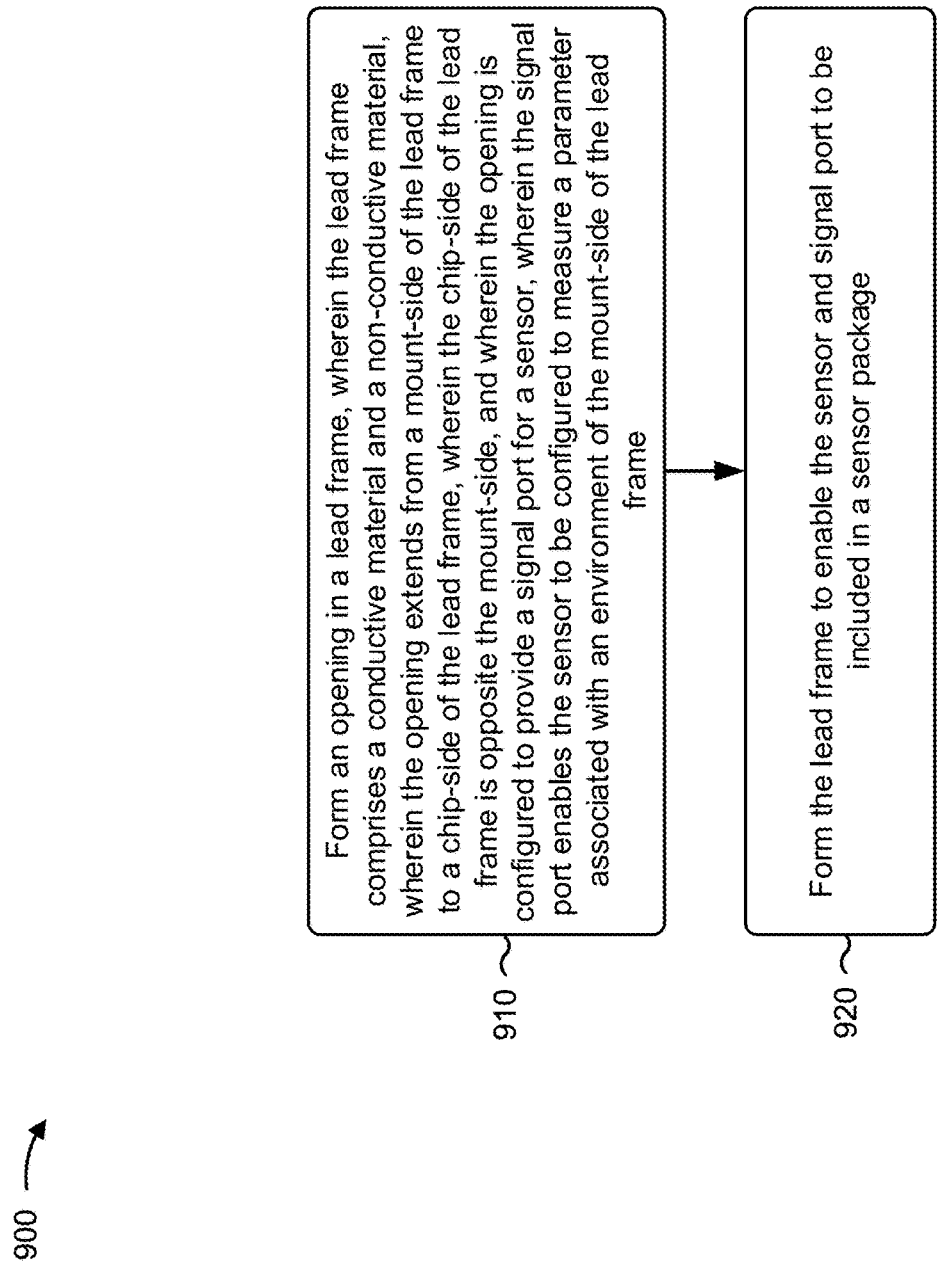
FIG. 9 is a flow chart of an example process associated with forming a molded lead frame described herein.

FIG. 9 is a flow chart of an example process 900 associated with providing an integrated circuit chip arrangement as described herein. In some implementations, one or more process blocks of FIG. 9 may be performed by a machine. For example, the machine may be associated with manufacturing, etching, and/or creating a molded lead frame, an integrated circuit package, and/or a sensor package that includes a molded lead frame with an opening, as described herein.

As shown in FIG. 9, process 900 may include forming an opening in a lead frame, wherein the lead frame comprises a conductive material and a non-conductive material, wherein the opening extends from a mount-side of the lead frame to a chip-side of the lead frame, wherein the chip-side of the lead frame is opposite the mount-side, and wherein the opening is configured to provide a signal port for a sensor, wherein the signal port enables the sensor to be configured to measure a parameter associated with an environment of the mount-side of the lead frame (block 910). For example, the machine may form the opening in the lead frame, as described above. In some implementations, the lead frame includes a conductive material and a non-conductive material. In some implementations, the opening extends from a mount-side of the lead frame to a chip-side of the lead frame. In some implementations, the chip-side of the lead frame is opposite the mount-side. In some implementations, the opening is configured to provide a signal port for a sensor. In some implementations, the signal port enables the sensor to be configured to measure a parameter associated with an environment of the mount-side of the lead frame.

As further shown in FIG. 9, process 900 may include forming the lead frame to enable the sensor and signal port to be included in a sensor package (block 920). For example, the machine may form the lead frame to enable the sensor and signal port to be included in a sensor package, as described above. In some implementations, the lead may be formed by etching a circuit into the lead frame.

Process 900 may include additional implementations, such as any single implementation or any combination of implementations described below and/or in connection with one or more other processes described elsewhere herein.

In some implementations, the machine may form the sensor package using a molding process. In some implementations, the molding process attaches molding material to the lead frame. In some implementations, the machine may mount the sensor to the chip-side of the lead frame and form the sensor package using a molding process. In some implementations, the molding process attaches molding material to the lead frame. In some implementations, the sensor is mounted on the chip-side of the lead frame to be aligned with the opening.

In some implementations, the machine may mount the sensor to the chip-side of the lead frame, mount a lid to the chip-side of the lead frame to enclose the sensor and the signal port relative to the chip-side of the lead frame, and form the sensor package using a molding process. In some implementations, the molding process attaches molding material to the lead frame and the lid.

In some implementations, the machine may mount the sensor to the chip-side of the lead frame and mount a component to the chip-side of the lead frame. In some implementations, the component is mounted over the opening to form the signal port. In some implementations, the sensor is configured to measure the parameter based on a signal received from the component. In some implementations, the machine may mount a lid to the chip-side of the lead frame to enclose the sensor and the component relative to the chip-side of the lead frame, form the sensor package using a molding process. In some implementations, the molding process attaches molding material to the lead frame and the lid. In some implementations, the machine, before mounting the lid to the chip-side, may bond the component to the sensor.

In some implementations, the machine may attach a conductive layer to the chip-side of the lead frame. In some implementations, the sensor is configured to be mounted to the conductive layer. In some implementations, the opening is formed through only the conductive material of the lead frame. In some implementations, the opening is formed at a wettable flank of the lead frame.

Although FIG. 9 shows example blocks of process 900, in some implementations, process 900 may include additional blocks, fewer blocks, different blocks, or differently arranged blocks than those depicted in FIG. 9. Additionally, or alternatively, two or more of the blocks of process 900 may be performed in parallel.

Figure 10:
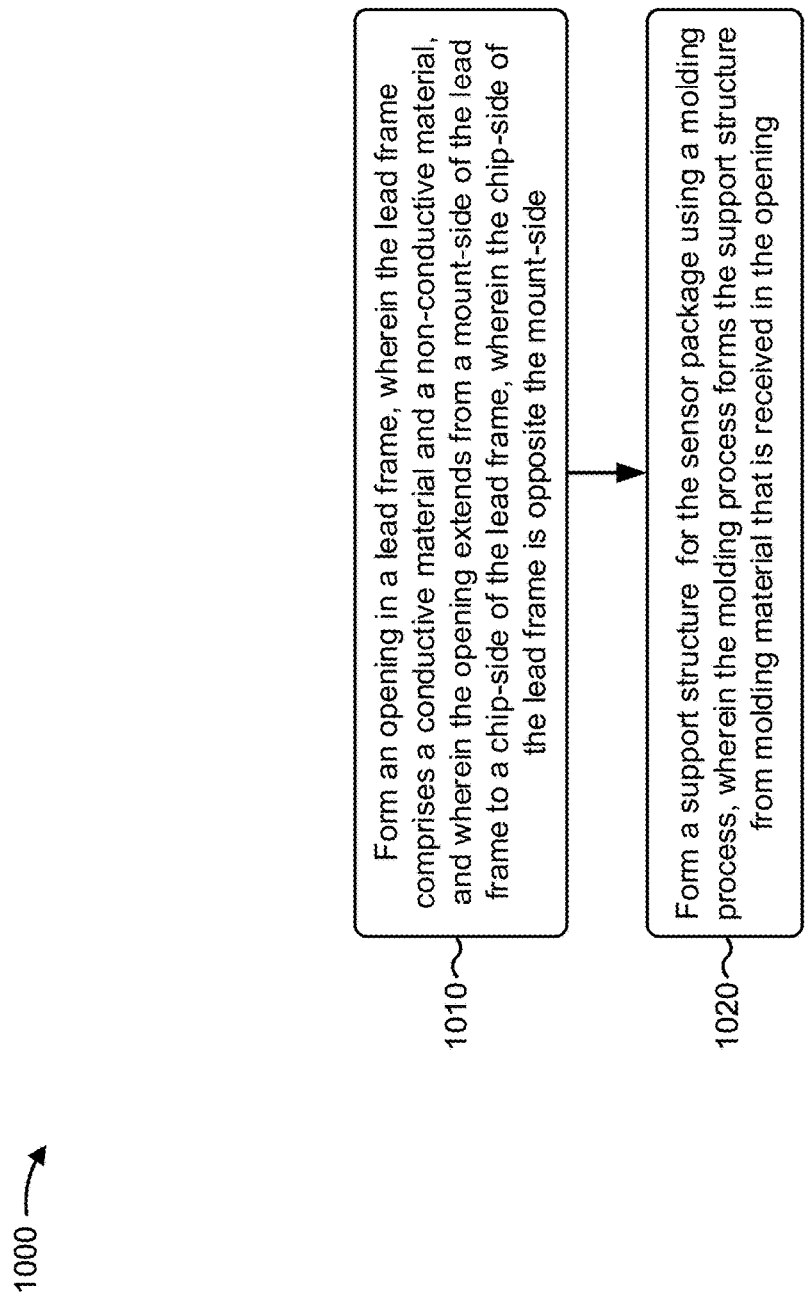
FIG. 10 is a flow chart of an example process associated with forming a sensor package described herein.

FIG. 10 is a flow chart of an example process 1000 associated with providing an integrated circuit chip arrangement as described herein. In some implementations, one or more process blocks of FIG. 10 may be performed by a machine. For example, the machine may be associated with manufacturing, etching, and/or creating a molded lead frame, an integrated circuit package, and/or a sensor package that includes a molded lead frame with an opening, as described herein.

As shown in FIG. 10, process 1000 may include forming an opening in a lead frame, wherein the lead frame comprises a conductive material and a non-conductive material, and wherein the opening extends from a mount-side of the lead frame to a chip-side of the lead frame, wherein the chip-side of the lead frame is opposite the mount-side (block 1010). For example, the machine may form the opening in the lead frame, as described above. In some implementations, the lead frame comprises a conductive material and a non-conductive material. In some implementations, the opening extends from a mount-side of the lead frame to a chip-side of the lead frame. In some implementations, the chip-side of the lead frame is opposite the mount-side.

As further shown in FIG. 10, process 1000 may include forming a support structure for the sensor package using a molding process, wherein the molding process forms the support structure from molding material that is received in the opening (block 1020). For example, the machine may form a support structure for the sensor package using a molding process, as described above. In some implementations, the molding process forms the support structure from molding material that is received in the opening.

Process 1000 may include additional implementations, such as any single implementation or any combination of implementations described below and/or in connection with one or more other processes described elsewhere herein.

In some implementations, the machine may mount a sensor to the chip-side of the lead frame. In some implementations, the sensor is mounted within a cavity of the sensor package formed by the support structure. In some implementations, the machine may mount a lid to the support structure to substantially enclose the sensor within an enclosure formed from the support structure and the lid.

In some implementations, the machine may the opening is formed through only the conductive material of the lead frame. In some implementations, the machine may the opening is formed at a wettable flank of the lead frame.

Although FIG. 10 shows example blocks of process 1000, in some implementations, process 1000 may include additional blocks, fewer blocks, different blocks, or differently arranged blocks than those depicted in FIG. 10. Additionally, or alternatively, two or more of the blocks of process 1000 may be performed in parallel.

The foregoing disclosure provides illustration and description, but is not intended to be exhaustive or to limit the implementations to the precise form disclosed. Modifications and variations may be made in light of the above disclosure or may be acquired from practice of the implementations.

As used herein, the term "component" is intended to be broadly construed as hardware, firmware, or a combination of hardware and software.

Some implementations are described herein in connection with thresholds. As used herein, satisfying a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

Even though particular combinations of features are recited in the claims and/or disclosed in the specification, these combinations are not intended to limit the disclosure of various implementations. In fact, many of these features may be combined in ways not specifically recited in the claims and/or disclosed in the specification. Although each dependent claim listed below may directly depend on only one claim, the disclosure of various implementations includes each dependent claim in combination with every other claim in the claim set.

No element, act, or instruction used herein should be construed as critical or essential unless explicitly described as such. Also, as used herein, the articles "a" and "an" are intended to include one or more items, and may be used interchangeably with "one or more." Furthermore, as used herein, the term "set" is intended to include one or more items (e.g., related items, unrelated items, a combination of related and unrelated items, etc.), and may be used interchangeably with "one or more." Where only one item is intended, the phrase "only one" or similar language is used. Also, as used herein, the terms "has," "have," "having," or the like are intended to be open-ended terms. Further, the phrase "based on" is intended to mean "based, at least in part, on" unless explicitly stated otherwise.

What is claimed is:

1. A method, comprising:
   forming an opening in a lead frame,
      wherein the lead frame comprises a conductive material and a non-conductive material,
      wherein the opening extends from a mount-side of the lead frame to a chip-side of the lead frame,
         wherein the chip-side of the lead frame is opposite the mount-side, and wherein the opening is configured to provide a signal port for a sensor,
         wherein the signal port enables the sensor to be configured to measure a parameter associated with an environment of the mount-side of the lead frame;
   forming the lead frame to enable the sensor and signal port to be included in a sensor package;
   mounting the sensor to the chip-side of the lead frame;
   mounting a lid to the chip-side of the lead frame to enclose the sensor and the signal port relative to the chip-side of the lead frame; and
   forming the sensor package using a molding process,
      wherein the molding process attaches molding material to the lead frame and the lid.

2. The method of claim 1, wherein the sensor is not aligned with the opening.

3. The method of claim 1, wherein the sensor is mounted on the chip-side of the lead frame to be aligned with the opening.

4. The method of claim 1, wherein the sensor is mounted to the chip-side of the lead frame using a die attach process.

5. The method of claim 1, further comprising:
   mounting a component to the chip-side of the lead frame,
      wherein the component is mounted over the opening to form the signal port, and
      wherein the sensor is configured to measure the parameter based on a signal received from the component.

6. The method of claim 5, further comprising:
   before mounting the lid to the chip-side of the lead frame, bonding the component to the sensor.

7. The method of claim 5, wherein the sensor is not aligned with the signal port.

8. The method of claim 1, further comprising:
   attaching a conductive layer to the chip-side of the lead frame,
      wherein the sensor is configured to be mounted to the conductive layer.

9. The method of claim 1, wherein the opening is formed through only the conductive material of the lead frame.

10. The method of claim 1, wherein the opening is formed at a wettable flank of the lead frame.

11. A method, comprising:
    forming an opening in a lead frame associated with a sensor package,
       wherein the lead frame comprises a conductive material and a non-conductive material, and
       wherein the opening extends from a mount-side of the lead frame to a chip-side of the lead frame, wherein the chip-side of the lead frame is opposite the mount-side;
mounting a sensor to the chip-side of the lead frame;
mounting a lid to enclose the sensor relative to the chip-side of the lead frame;
forming the sensor package using a first molding process,
wherein the first molding process attaches first molding material to the lead frame and the lid; and
forming a support structure for the sensor package using a second molding process,
wherein the second molding process forms the support structure from second molding material that is received in the opening.

12. The method of claim 11,
wherein the sensor is mounted within a cavity of the sensor package formed by the support structure.

13. The method of claim 12, wherein the lid is mounted to the support structure to substantially enclose the sensor within an enclosure formed from the support structure and the lid.

14. The method of claim 11, wherein the opening is formed through only the conductive material of the lead frame.

15. The method of claim 11, wherein the opening is formed at a wettable flank of the lead frame.

16. A sensor package, comprising:
a molded lead frame that includes an opening in the molded lead frame,
wherein the opening extends from a mount-side of the molded lead frame to a chip-side of the molded lead frame,
wherein the chip-side of the molded lead frame is opposite the mount-side;
a sensor mounted to the chip-side of the molded lead frame; and
a lid mounted to the chip-side of the molded lead frame to enclose the sensor relative to the chip-side of the molded lead frame,
wherein mold material is attached to the lid.

17. The sensor package of claim 16, wherein the opening is configured to provide a signal port to the sensor to enable the sensor to measure a parameter associated with an environment on the mount-side of the molded lead frame.

18. The sensor package of claim 16, wherein at least a portion of the sensor is aligned with the opening.

19. The sensor package of claim 16, wherein the opening includes the mold material,
wherein the mold material forms a support structure for the sensor package.

20. The sensor package of claim 16, wherein the sensor comprises at least one of:
a microphone,
a pressure sensor,
a gas sensor,
a magnetic sensor, or
a light sensor.

* * * * *